US012804970B2

(12) United States Patent
Xie et al.

(10) Patent No.: US 12,804,970 B2
(45) Date of Patent: Nov. 17, 2026

(54) SEMICONDUCTOR STRUCTURES HAVING ANGLED DIELECTRIC BARS ATTACHED TO NANOSHEET CHANNEL LAYERS

(71) Applicant: International Business Machines Corporation, Armonk, NY (US)

(72) Inventors: Ruilong Xie, Niskayuna, NY (US); David Wolpert, Poughkeepsie, NY (US); Brent A. Anderson, Jericho, VT (US); Nicholas Anthony Lanzillo, Wynantskill, NY (US); Albert M. Chu, Nashua, NH (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 18/515,560

(22) Filed: Nov. 21, 2023

(65) Prior Publication Data

US 2025/0169131 A1 May 22, 2025

(51) Int. Cl.

| | |
|---|---|
| ***H01L 29/06*** | (2006.01) |
| ***H10D 30/43*** | (2025.01) |
| ***H10D 30/67*** | (2025.01) |
| ***H10D 62/10*** | (2025.01) |
| ***H10D 84/85*** | (2025.01) |

(52) U.S. Cl.

CPC ........... *H10D 62/121* (2025.01); *H10D 30/43* (2025.01); *H10D 30/6735* (2025.01); *H10D 30/6757* (2025.01); *H10D 84/85* (2025.01)

(58) Field of Classification Search

CPC .. H10D 62/121; H10D 30/43; H10D 30/6735; H10D 30/6757; H10D 84/85; H10D 30/014; H10D 84/038

See application file for complete search history.

(56) References Cited

U.S. PATENT DOCUMENTS

| | | | |
|---|---|---|---|
| 9,614,056 | B2 | 4/2017 | Xie et al. |
| 10,388,745 | B1 | 8/2019 | Sung |
| 10,685,865 | B2 | 6/2020 | Sung et al. |
| 10,707,206 | B2 | 7/2020 | Zang et al. |
| 10,720,357 | B2 | 7/2020 | Sung et al. |
| 10,755,965 | B2 | 8/2020 | Sung |
| 10,811,304 | B2 | 10/2020 | Sung et al. |
| 10,930,735 | B2 | 2/2021 | Sung et al. |
| 10,971,403 | B2 | 4/2021 | Sung et al. |
| 11,018,138 | B2 | 5/2021 | Varghese et al. |
| 11,205,593 | B2 | 12/2021 | Sung et al. |
| 11,217,491 | B2 | 1/2022 | Sung et al. |
| 11,664,377 | B2 | 5/2023 | Lilak et al. |

(Continued)

FOREIGN PATENT DOCUMENTS

EP 4243078 A1 9/2023

*Primary Examiner* — Cuong B Nguyen

(74) *Attorney, Agent, or Firm* — Kimberly Zillig; Ryan, Mason & Lewis, LLP

(57) ABSTRACT

A semiconductor structure includes a substrate, one or more nanosheet channel layers disposed over the substrate, and a dielectric bar attached to the one or more nanosheet channel layers, where the dielectric bar is not perpendicular to the substrate. The one or more nanosheet channel layers include a first set of one or more nanosheet channels attached to a first side of the dielectric bar and a second set of one or more nanosheet channels attached to a second side of the dielectric bar.

18 Claims, 9 Drawing Sheets

(56) References Cited

U.S. PATENT DOCUMENTS

| | | | |
|---|---|---|---|
| 11,682,591 B2 | 6/2023 | Chan et al. | |
| 11,700,721 B2 | 7/2023 | Varghese | |
| 2020/0027832 A1 | 1/2020 | Varghese et al. | |
| 2021/0210489 A1 | 7/2021 | Zhang et al. | |
| 2022/0052185 A1 | 2/2022 | Zhou | |
| 2023/0126135 A1 | 4/2023 | Neumann et al. | |
| 2024/0105786 A1 * | 3/2024 | Liang | H10D 62/021 |

* cited by examiner

SEMICONDUCTOR STRUCTURES HAVING ANGLED DIELECTRIC BARS ATTACHED TO NANOSHEET CHANNEL LAYERS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

A field-effect transistor (FET) is a three-terminal device having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the area of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm node and beyond. A general process flow for formation of a nanosheet stack involves removing sacrificial layers, which may be formed of Silicon Germanium (SiGe), between sheets of channel material, which may be formed of Silicon (Si).

For continued scaling and area improvement, stacked transistor structures may be used. A stacked transistor structure may include multiple transistors stacked over one another vertically. With stacked transistor structures, for example, vias which extend between the frontside and the backside may have a high aspect ratio. The formation of high aspect ratio vias, however, presents various process challenges.

SUMMARY

Embodiments of the invention provide techniques for forming semiconductor structures having angled dielectric bars attached to nanosheet channel layers.

In one embodiment, a semiconductor structure includes a substrate, one or more nanosheet channel layers disposed over the substrate, and a dielectric bar attached to the one or more nanosheet channel layers, where the dielectric bar is not perpendicular to the substrate.

The semiconductor structure advantageously enables tuning of an n-to-p ratio of transistors having channels provided by portions of the nanosheet channel layers on either side of the dielectric bar. The angle of the dielectric bar is controllable to tune the n-to-p ratio as desired.

In another exemplary embodiment, as may be combined with the preceding paragraphs, the one or more nanosheet channel layers may include a first set of one or more nanosheet channels attached to a first side of the dielectric bar and a second set of one or more nanosheet channels attached to a second side of the dielectric bar. The first set of one or more nanosheet channels may be channels for n-type transistors and the second set of one or more nanosheet channels may be channels for p-type transistors. An n-to-p ratio of the first set of one or more nanosheet channels to the second set of one or more nanosheet channels is a function of an angle of the dielectric bar.

In another exemplary embodiment, as may be combined with the preceding paragraphs, the semiconductor structure may further include one or more additional nanosheet channel layers disposed over the substrate, and an additional dielectric bar attached to the one or more additional nanosheet channel layers, the additional dielectric bar being perpendicular to the substrate. The one or more nanosheet channel layers include a first set of one or more nanosheet channels attached to a first side of the dielectric bar providing channels for a first set of n-type transistors and a second set of one or more nanosheet channels attached to a second side of the dielectric bar providing channels for a first set of p-type transistors, and the one or more additional nanosheet channel layers include a third set of one or more nanosheet channels attached to a first side of the additional dielectric bar providing channels for a second set of n-type transistors and a fourth set of one or more nanosheet channels attached to a second side of the additional dielectric bar providing channels for a second set of p-type transistors. The first set of one or more nanosheet channels and the second set of one or more nanosheet channels may have a first n-to-p ratio, and the third set of one or more nanosheet channels and the fourth set of one or more nanosheet channels may have a second n-to-p ratio, the second n-to-p ratio being different than the first n-to-p ratio.

In another exemplary embodiment, as may be combined with the preceding paragraphs, the semiconductor structure may further include a gate stack surrounding the one or more nanosheet channel layers, where the dielectric bar is recessed below a top surface of the gate stack.

In another embodiment, a transistor structure includes a substrate, one or more nanosheet channel layers disposed over the substrate, the one or more nanosheet channel layers providing channels for a complementary metal-oxide-semiconductor device, and a dielectric bar attached to the one or more nanosheet channel layers, where the dielectric bar is not perpendicular to the substrate.

The transistor structure advantageously enables tuning of an n-to-p ratio of the complementary metal-oxide-semiconductor device having channels provided by portions of the nanosheet channel layers on either side of the dielectric bar. The angle of the dielectric bar is controllable to tune the n-to-p ratio as desired.

In another exemplary embodiment, as may be combined with the preceding paragraphs, the one or more nanosheet channel layers may include a first set of one or more nanosheet channels attached to a first side of the dielectric bar providing channels for an n-type transistor of the complementary metal-oxide-semiconductor device and a second set of one or more nanosheet channels attached to a second side of the dielectric bar providing channels for a p-type transistor of the complementary metal-oxide-semiconductor device.

In another exemplary embodiment, as may be combined with the preceding paragraphs, an n-to-p ratio of the complementary metal-oxide-semiconductor device may be a function of an angle of the dielectric bar.

In another exemplary embodiment, as may be combined with the preceding paragraphs, the transistor structure may further include one or more additional nanosheet channel layers disposed over the substrate, the one or more additional nanosheet channel layers providing channels for an additional complementary metal-oxide-semiconductor device, and an additional dielectric bar attached to the one or more additional nanosheet channel layers, the additional dielectric bar being perpendicular to the substrate. The one or more nanosheet channel layers may include a first set of one or more nanosheet channels attached to a first side of the dielectric bar providing channels for an n-type transistor of the complementary metal-oxide-semiconductor device and a second set of one or more nanosheet channels attached to a second side of the dielectric bar providing channels for a p-type transistor of the complementary metal-oxide-semiconductor device, and the one or more additional nanosheet channel layers may include a third set of one or more nanosheet channels attached to a first side of the additional dielectric bar providing channels for an n-type transistor of the additional complementary metal-oxide-semiconductor device and a fourth set of one or more nanosheet channels attached to a second side of the additional dielectric bar providing channels for a p-type transistor of the additional complementary metal-oxide-semiconductor device. The complementary metal-oxide-semiconductor device may have a first n-to-p ratio, and the additional complementary metal-oxide-semiconductor device may have a second n-to-p ratio, the second n-to-p ratio being different than the first n-to-p ratio.

In another exemplary embodiment, as may be combined with the preceding paragraphs, the transistor structure may further include a gate stack surrounding the one or more nanosheet channel layers, where the dielectric bar is recessed below a top surface of the gate stack.

In another exemplary embodiment, as may be combined with the preceding paragraphs, the complementary metal-oxide-semiconductor device may utilize a forksheet transistor architecture.

In another embodiment, an integrated circuit includes a transistor structure including a substrate, one or more nanosheet channel layers disposed over the substrate, the one or more nanosheet channel layers providing channels for a complementary metal-oxide-semiconductor device, and a dielectric bar attached to the one or more nanosheet channel layers, where the dielectric bar is not perpendicular to the substrate.

The integrated circuit advantageously enables tuning of an n-to-p ratio of the complementary metal-oxide-semiconductor device of the transistor structure, which has channels provided by portions of the nanosheet channel layers on either side of the dielectric bar. The angle of the dielectric bar is controllable to tune the n-to-p ratio as desired.

In another exemplary embodiment, as may be combined with the preceding paragraphs, the one or more nanosheet channel layers may include a first set of one or more nanosheet channels attached to a first side of the dielectric bar providing channels for an n-type transistor of the complementary metal-oxide-semiconductor device and a second set of one or more nanosheet channels attached to a second side of the dielectric bar providing channels for a p-type transistor of the complementary metal-oxide-semiconductor device.

In another exemplary embodiment, as may be combined with the preceding paragraphs, the transistor structure may further include one or more additional nanosheet channel layers disposed over the substrate, the one or more additional nanosheet channel layers providing channels for an additional complementary metal-oxide-semiconductor device, and an additional dielectric bar attached to the one or more additional nanosheet channel layers, the additional dielectric bar being perpendicular to the substrate. The complementary metal-oxide-semiconductor device may have a first n-to-p ratio, and the additional complementary metal-oxide-semiconductor device may have a second n-to-p ratio, the second n-to-p ratio being different than the first n-to-p ratio.

DETAILED DESCRIPTION

Figure 1C:
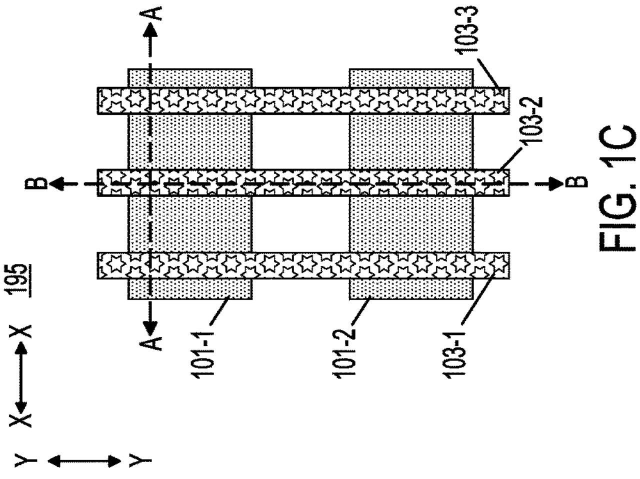
FIG. 1C depicts a top-down view illustrating where the first and second cross-sectional views of FIGS. 1A and 1B are taken, according to an embodiment of the invention.

Illustrative embodiments of the invention may be described herein in the context of illustrative methods for forming semiconductor structures having angled dielectric bars attached to nanosheet channel layers, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms “exemplary” and “illustrative” as used herein mean “serving as an example, instance, or illustration.” Any embodiment or design described herein as “exemplary” or “illustrative” is not to be construed as preferred or advantageous over other embodiments or designs.

A “forksheet” transistor architecture integrates n-type field-effect transistors (nFETs) and p-type field-effect transistors (pFETs) with channel layers for the nFETs and pFETs being separated by a dielectric wall (also referred to as a dielectric bar). For example, nanosheet transistor architectures may include nanosheet channels with dielectric walls formed vertically through a middle of the nanosheet channels, with portions of the nanosheet channels on one side of the dielectric walls providing nFETs and portions of the nanosheet channels on the other side of the dielectric walls providing pFETs. Such transistor architectures advantageously enable reduced n-to-p (N2P) spacing and corresponding reductions in area.

Illustrative embodiments provide techniques for tuning the N2P ratio for transistor structures, including transistor structures which utilize the forksheet transistor architecture. In some embodiments, a semiconductor structure includes a set of nanosheet channel layers formed over a substrate, with the nanosheet channel layers being attached to a dielectric bar, where the dielectric bar is angled (e.g., is not perpendicular to the substrate). The nanosheet channel layers may be part of a complementary metal-oxide semiconductor (CMOS) device, where portions of the nanosheet channel layers attached to a first side of the angled dielectric bar provide nFET channels and portions of the nanosheet channel layers attached to a second side of the angled dielectric bar provide pFET channels. The semiconductor structure may include one or more additional CMOS devices having dielectric bars to which nanosheet channel layers are attached. The dielectric bar for at least one of such additional CMOS devices may be vertical (e.g., perpendicular to the substrate). For example, portions of the nanosheet channel layers attached to a first side of the vertical dielectric bar may provide nFET channels and portions of the nanosheet channel layers attached to a second side of the vertical dielectric bar may provide pFET channels. The N2P ratio associated with the CMOS device having the angled dielectric bar is different than the N2P ratio associated with the additional CMOS device having the vertical dielectric bar.

A method for forming an angled dielectric bar includes forming a nanosheet stack (e.g., of alternating sacrificial and nanosheet channel layers) over a substrate, forming and patterning dummy gates, and forming source/drain regions. Nanosheet and gate cut processes are then performed to form at least one angled cut trench through the dummy gates and the nanosheet stack. The angled cut trench is then filled with a dielectric material, followed by replacement metal gate (RMG) processing (e.g., removal of the dummy gates and sacrificial layers of the nanosheet stack and formation of a gate stack). Contacts (e.g., middle-of-line (MOL) contacts) are then formed, followed by a back-end-of-line (BEOL) region.

FIGS. 1A-8C show a process flow for forming angled dielectric bars enabling flexible N2P ratios for transistor devices, including transistor devices utilizing a forksheet transistor architecture.

Figure 1B:
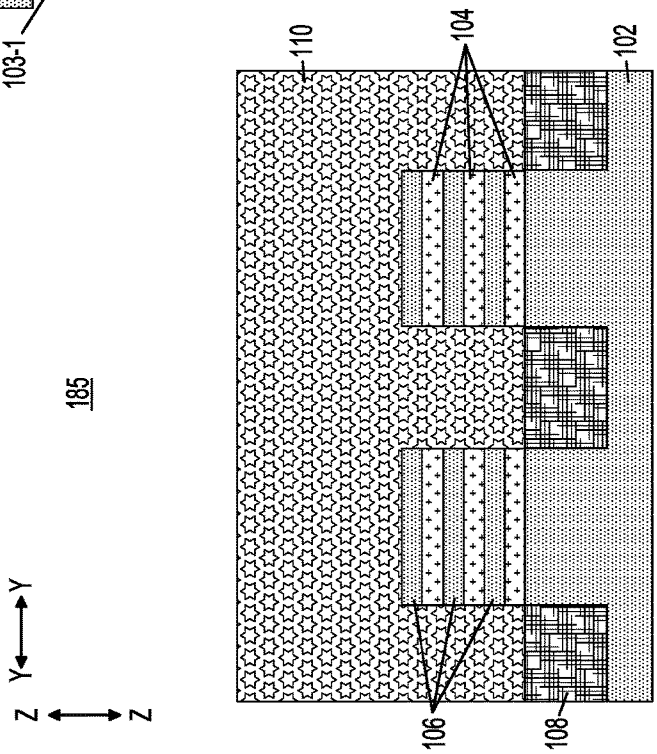
FIG. 1B depicts a second cross-sectional view of the semiconductor structure following the formation of the dummy gate structures, according to an embodiment of the invention.
Figure 1A:
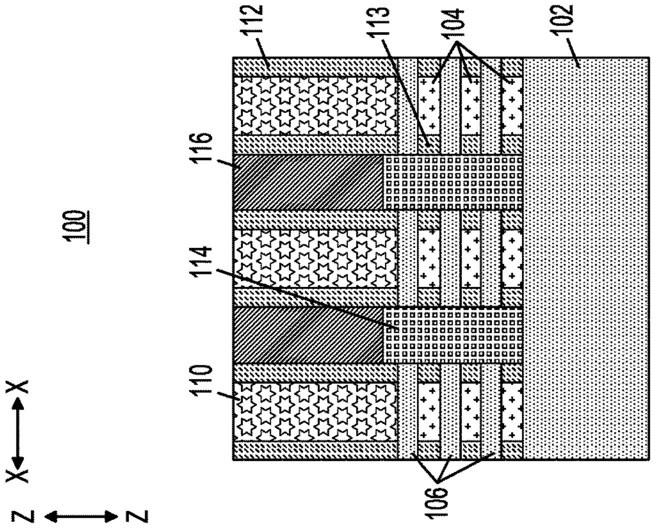
FIG. 1A depicts a first cross-sectional view of a semiconductor structure following formation of dummy gate structures, according to an embodiment of the invention.

FIGS. 1A-1C show different views of a semiconductor structure. FIG. 1A shows a first cross-sectional view 100 of the semiconductor structure, and FIG. 1B shows a second cross-sectional view 185 of the semiconductor structure. FIG. 1C shows a top-down view 195, illustrating where the first and second cross-sectional views 100 and 185 of FIGS. 1A and 1B are taken. FIG. 1C shows active regions 101-1 and 101-2 (collectively, active regions 101) and gate regions 103-1, 103-2 and 103-3 (collectively, gate regions 103). The first cross-sectional view 100 of FIG. 1A is taken along the line A-A shown in the top-down view 195 of FIG. 1C (e.g., along the active region 101-1 and across the gate regions 103). The second cross-sectional view 185 of FIG. 1B is taken along the line B-B shown in the top-down view 195 of FIG. 1C (e.g., along the gate region 103-2 and across the active regions 101).

As shown in FIGS. 1A and 1B, the semiconductor structure includes a substrate 102, a nanosheet stack including sacrificial layers 104 and nanosheet channel layers 106, shallow trench isolation (STI) regions 108, a dummy gate layer 110, a spacer layer 112, inner spacers 113, source/drain regions 114, and an interlayer dielectric (ILD) layer 116.

The substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The substrate 102 may have a height (in direction Z) and widths (in directions X/Y) which vary as needed based on the type of structures to be formed.

The sacrificial layers 104 may be formed of SiGe. Each of the sacrificial layers 104 may have a thickness (in direction Z) in the range of 5-15 nm.

The nanosheet channel layers 106 will provide channels for transistors in a transistor structure (e.g., a transistor structure utilizing a forksheet transistor architecture). The nanosheet channel layers 106 may be formed of Si or another suitable material (e.g., a material similar to that used for the substrate 102). Each of the nanosheet channel layers 106 may have a thickness (in direction Z) in the range of 5-15 nm.

The STI regions 108 may be formed of a dielectric material such as silicon dioxide ($SiO_2$), SiN, silicon oxycarbide (SiOC), silicon oxynitride (SiON), etc. The STI regions 108 may have a height (in direction Z) in the range of 10 to 200 nm.

The dummy gate layer 110 may be formed of amorphous silicon (a-Si), amorphous silicon germanium (a-SiGe) over a thin $SiO_2$ or titanium nitride (TiN) layer, or another suitable material.

The spacer layer 112 and the inner spacers 113 may be formed of silicon boron carbide nitride (SiBCN) or another suitable material such as SiN, SiOC, silicon oxycarbonitride (SiOCN), etc. The spacer layer 112 may have a thickness in the range of 4 to 10 nm. The spacer layer 112 on sidewalls of the dummy gate layer 110 provide gate spacers.

The source/drain regions 114 may be formed using an epitaxial growth process. The source/drain regions 114 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, the epitaxy process used to form the source/drain regions 114 comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$. The source/drain regions 114 may have widths (in direction Y) in the range of 10 to 100 nm, and may have heights (in direction Z) in the range of 20 to 100 nm.

The ILD layer 116 material may be formed of any suitable isolating material, such as $SiO_2$, SiOC, SiON, etc. The ILD layer 116 may have a height (in direction Z) matching that of the dummy gate layer 110.

The semiconductor structure may be formed by depositing the nanosheet stack (e.g., the sacrificial layers 104 and the nanosheet channel layers 106) over the substrate 102. The nanosheet stack may then be patterned (e.g., using lithographic processing), followed by fill with material of the STI regions 108 and recess of the material of the STI regions 108. The dummy gate layer 110 is then patterned using a hard mask (not shown), The spacer layer 112 is then formed, followed by nanosheet recess and an indent etch to indent the sacrificial layers 104. The inner spacers 113 are formed by filling the indents. The source/drain regions 114 are then epitaxially grown, followed by deposition and planarization (e.g., using chemical mechanical planarization (CMP)) of the ILD layer 116.

Figure 2C:
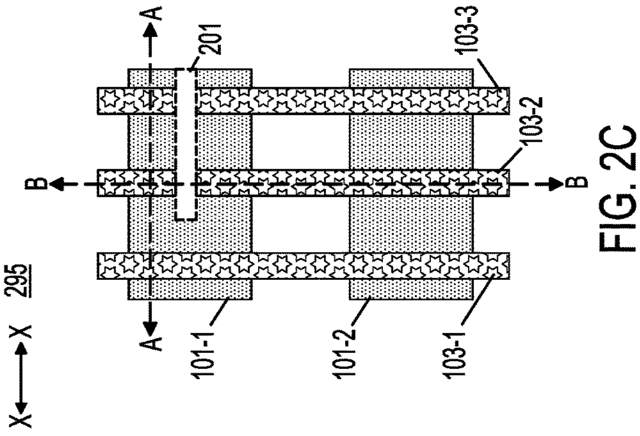
FIG. 2C depicts a top-down view illustrating where the first and second cross-sectional views of FIGS. 2A and 2B are taken, according to an embodiment of the invention.
Figure 2B:
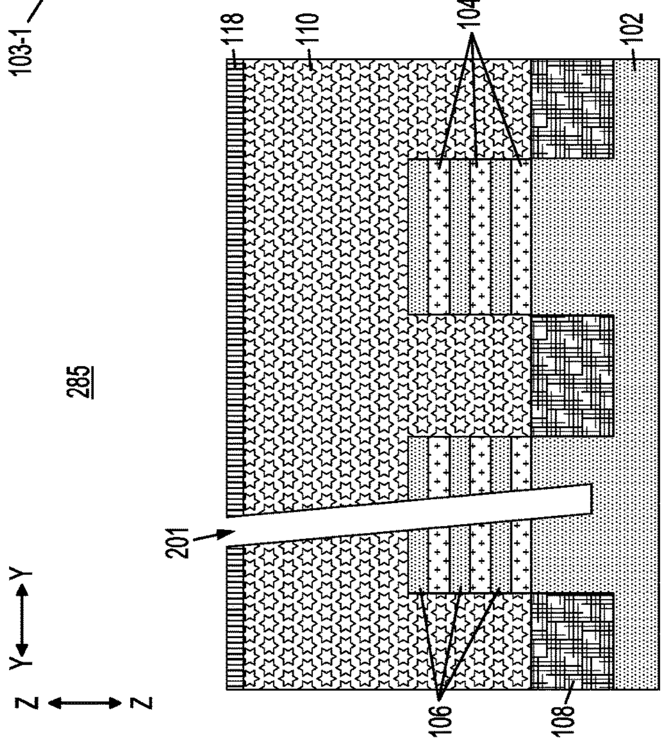
FIG. 2B depicts a second cross-sectional view of the semiconductor structure of FIGS. 1A-1C following the formation of the angled cut trench, according to an embodiment of the invention.
Figure 2A:
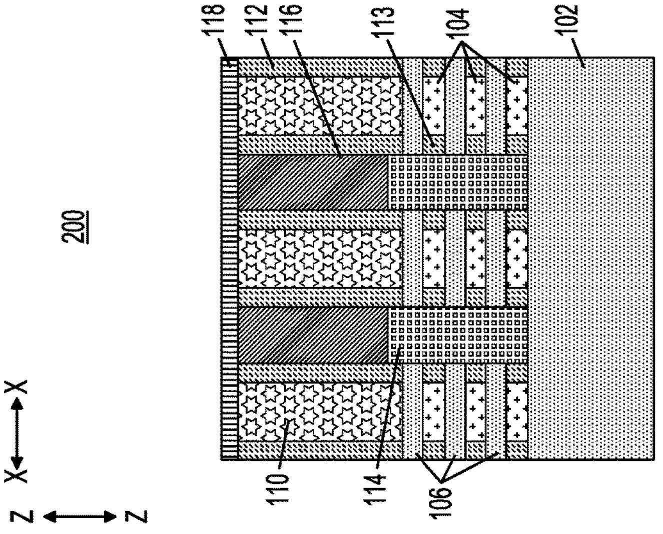
FIG. 2A depicts a first cross-sectional view of the semiconductor structure of FIGS. 1A-1C following formation of an angled cut trench, according to an embodiment of the invention.

FIGS. 2A-2C show different views of the structure of FIGS. 1A-1C following formation of an angled cut trench 201. FIG. 2A shows a first cross-sectional view 200 of the semiconductor structure, and FIG. 2B shows a second cross-sectional view 285 of the semiconductor structure. FIG. 2C shows a top-down view 295, illustrating where the first and second cross-sectional views 200 and 285 of FIGS. 2A and 2B are taken. The first cross-sectional view 200 of FIG. 2A is taken along the line A-A shown in the top-down view 295 of FIG. 2C. The second cross-sectional view 285 of FIG. 2B is taken along the line B-B shown in the top-down view 295 of FIG. 2C.

To form the angled cut trench 201, a hard mask 118 is first patterned over the structure. The hard mask 118 may be formed of any material suitable for angled reactive-ion etching (RIE) or another angled etch process such as ion beam etching (IBE). Such a material includes, for example, titanium nitride (TiN), titanium oxide ($TiO_x$), aluminum oxide ($AlO_x$), aluminum nitride ($AlN_x$), SiN, $SiO_2$, SiON, SiOCN, SiC, etc. The hard mask 118 may have a height (in direction Z) in the range of 3 to 50 nm. An angled etch (e.g., angled reactive-ion etching (RIE), ion beam etching (IBE) or other suitable processing) is then performed to remove portions of the dummy gate layer 110 and the nanosheet stack to form the angled cut trench 201. The angled cut trench 201 may have a width in the range of 10 to 50 nm. The angle of the angled etch may be in the range of 3 to 45 degrees. The angle may be selected in order to tune the N2P ration of a CMOS device (e.g., a forksheet transistor device) as described elsewhere herein.

Figures 3A, 3B, 3C:
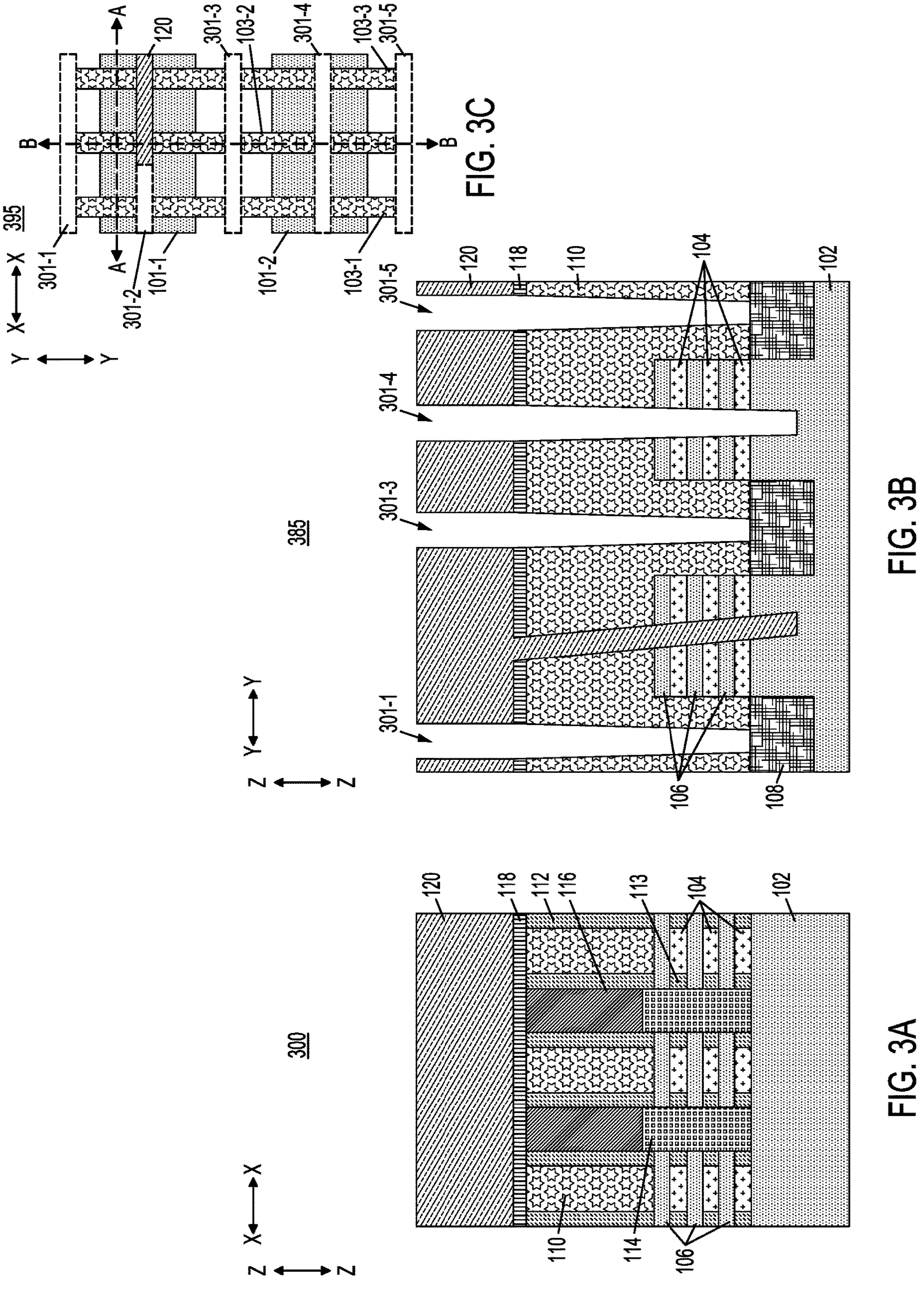
FIG. 3A depicts a first cross-sectional view of the semiconductor structure of FIGS. 2A-2C following formation of gate cut trenches, according to an embodiment of the invention.
FIG. 3B depicts a second cross-sectional view of the semiconductor structure of FIGS. 2A-2C following the formation of the gate cut trenches, according to an embodiment of the invention.
FIG. 3C depicts a top-down view illustrating where the first and second cross-sectional views of FIGS. 3A and 3B are taken, according to an embodiment of the invention.

FIGS. 3A-3C show different views of the structure of FIGS. 2A-2C following fill of the angled cut trench 201 with an organic planarization layer (OPL) 120 and following formation of gate cut trenches 301-1, 301-2, 301-3, 301-4 and 301-5 (collectively, gate cut trenches 301). FIG. 3A shows a first cross-sectional view 300 of the semiconductor structure, and FIG. 3B shows a second cross-sectional view 385 of the semiconductor structure. FIG. 3C shows a top-down view 395, illustrating where the first and second cross-sectional views 300 and 385 of FIGS. 3A and 3B are taken. The first cross-sectional view 300 of FIG. 3A is taken along the line A-A shown in the top-down view 395 of FIG. 3C. The second cross-sectional view 385 of FIG. 3B is taken along the line B-B shown in the top-down view 395 of FIG. 3C.

The OPL 120 is deposited, which fills and protects the angled cut trench 201 during the gate cut processing. The OPL 120 is then patterned to form openings where the gate cut trenches 301 will be formed. The gate cut trenches 301 are then formed by etching through the underlying hard mask 118 and dummy gate layer 110. As shown in the top-down view 395 of FIG. 3C, the gate cut trench 301-2 is only formed across the gate region 103-1, while the angled cut trench 201 filled with the OPL 120 is formed across the gate regions 103-2 and 103-3.

Figure 4C:
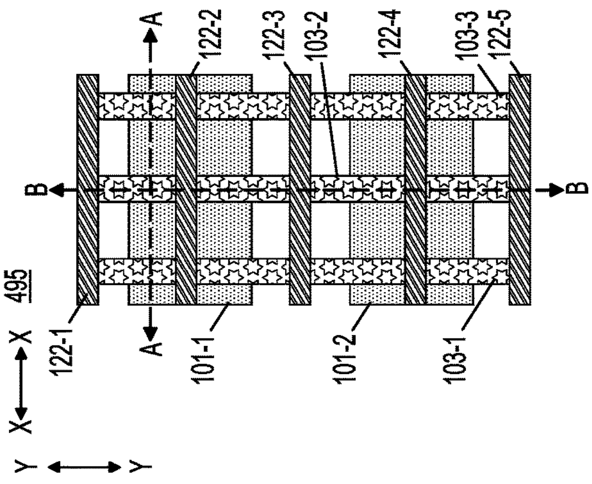
FIG. 4C depicts a top-down view illustrating where the first and second cross-sectional views of FIGS. 4A and 4B are taken, according to an embodiment of the invention.
Figure 4B:
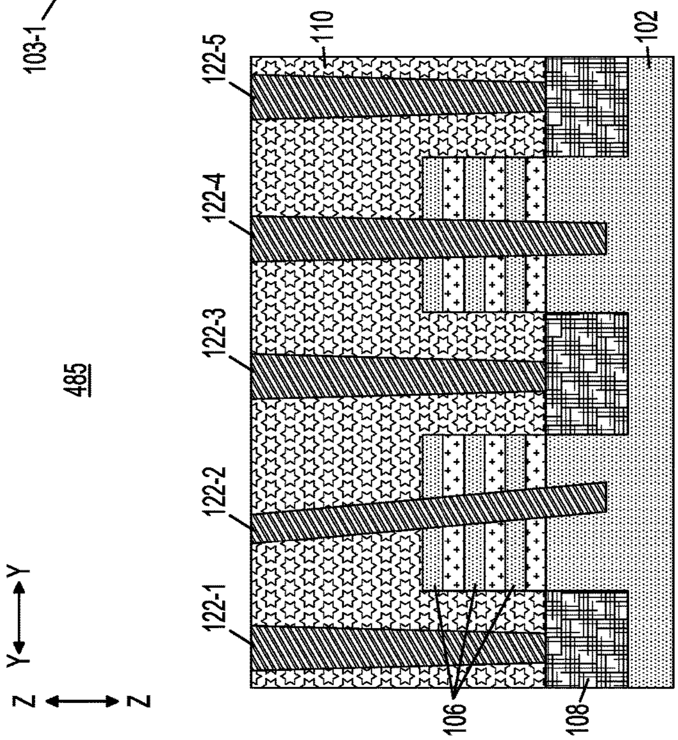
FIG. 4B depicts a second cross-sectional view of the semiconductor structure of FIGS. 3A-3C following the formation and planarization of the dielectric material in the angled cut trench and the gate cut trenches, according to an embodiment of the invention.
Figure 4A:
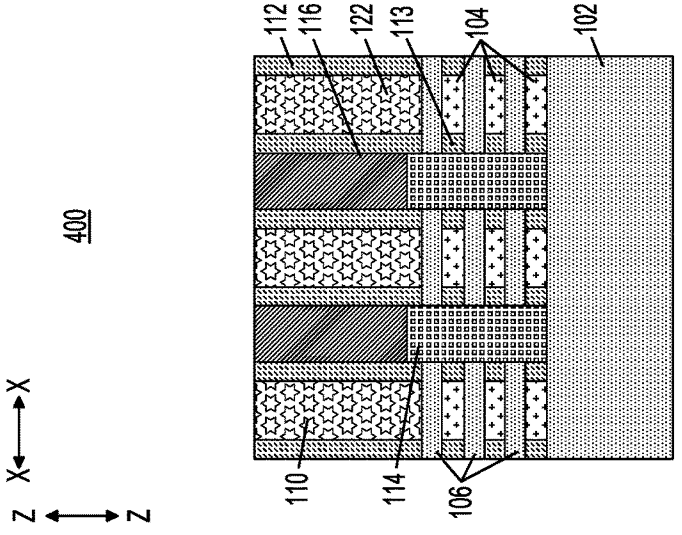
FIG. 4A depicts a first cross-sectional view of the semiconductor structure of FIGS. 3A-3C following formation and planarization of dielectric material in the angled cut trench and the gate cut trenches, according to an embodiment of the invention.

FIGS. 4A-4C show different views of the structure of FIGS. 3A-3C following fill of a dielectric material in the angled cut trench 201 and the gate cut trenches 301. FIG. 4A shows a first cross-sectional view 400 of the semiconductor structure, and FIG. 4B shows a second cross-sectional view 485 of the semiconductor structure. FIG. 4C shows a top-down view 495, illustrating where the first and second cross-sectional views 400 and 485 of FIGS. 4A and 4B are taken. The first cross-sectional view 400 of FIG. 4A is taken along the line A-A shown in the top-down view 495 of FIG. 4C. The second cross-sectional view 485 of FIG. 4B is taken along the line B-B shown in the top-down view 495 of FIG. 4C.

The OPL 120 is removed from the structure, including from the angled cut trench 201. A dielectric material (e.g., SiN, SiOCN, SiBCN, SiOC, SiO2, SiC, etc.) is then filled in the angled cut trench 201 and the gate cut trenches 301 to form gate cut 122-1, angled dielectric bar 122-2, gate cut 122-3, vertical dielectric bar 122-4, and gate cut 122-5. The dielectric material is then planarized (e.g., using CMP), which removes the hard mask 118.

Figure 5C:
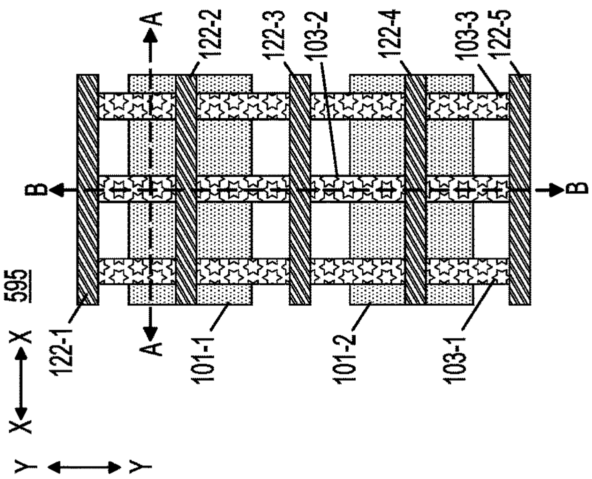
FIG. 5C depicts a top-down view illustrating where the first and second cross-sectional views of FIGS. 5A and 5B are taken, according to an embodiment of the invention.
Figure 5B:
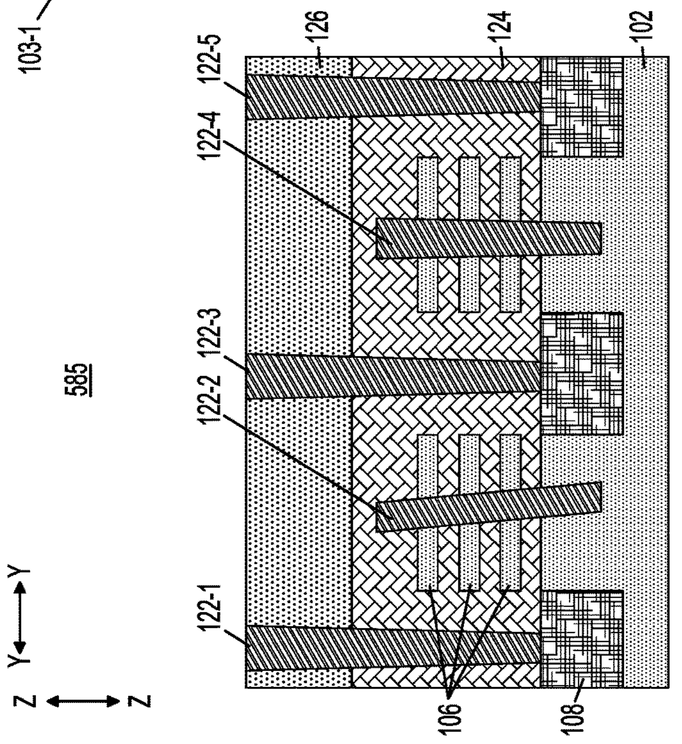
FIG. 5B depicts a second cross-sectional view of the semiconductor structure of FIGS. 4A-4C following the formation of the gate stacks and the self-aligned contact capping layers, where the angled and vertical dielectric bars separating the nanosheet channel layers are recessed below the top surfaces of the gate stacks, according to an embodiment of the invention.
Figure 5A:
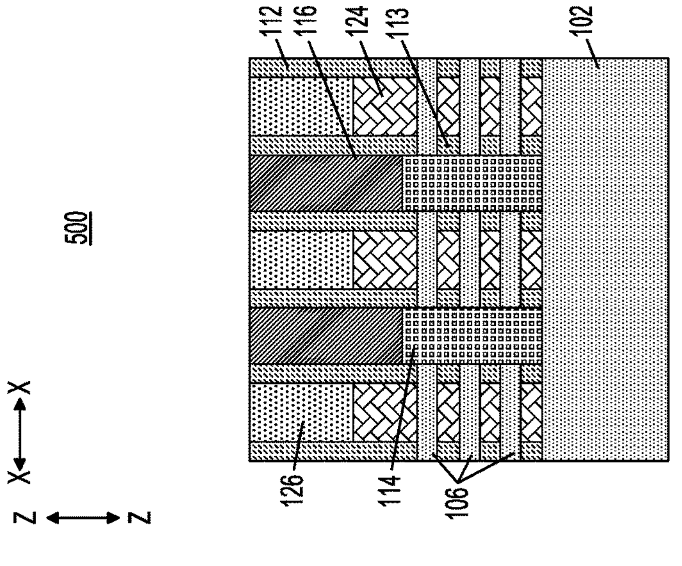
FIG. 5A depicts a first cross-sectional view of the semiconductor structure of FIGS. 4A-4C following formation of gate stacks and self-aligned contact capping layers, where angled and vertical dielectric bars separating nanosheet channel layers are recessed below top surfaces of the gate stacks, according to an embodiment of the invention.

FIGS. 5A-5C show different views of the structure of FIGS. 4A-4C following replacement metal gate (RMG) processing. FIG. 5A shows a first cross-sectional view 500 of the semiconductor structure, and FIG. 5B shows a second cross-sectional view 585 of the semiconductor structure. FIG. 5C shows a top-down view 595, illustrating where the first and second cross-sectional views 500 and 585 of FIGS. 5A and 5B are taken. The first cross-sectional view 500 of FIG. 5A is taken along the line A-A shown in the top-down view 595 of FIG. 5C. The second cross-sectional view 585 of FIG. 5B is taken along the line B-B shown in the top-down view 595 of FIG. 5C.

The RMG processing includes removal of the dummy gate layer 110 and sacrificial layers 104, followed by formation of a gate stack 124. The gate stack 124 is then recessed, followed by formation of self-aligned contact (SAC) capping layers 126.

The gate stack 124 may include a gate dielectric and a gate conductor. The gate dielectric may be conformally deposited in the structure, and may be formed of a high-k material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric may have a uniform thickness in the range of 1 nm to 3 nm. The gate conductor may include a gate work function metal (WFM) layer and a gate metal layer. The gate WFM layer may be formed of a WFM such as titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. The gate WFM layer may have a uniform thickness in the range of 1 to 10 nm. The gate metal layer may comprise a conductive metal (e.g., tungsten (W)).

The SAC capping layer 126 may be formed of SiN, SiBCN, SiOCN, SiOC, etc. The SAC capping layer 126 may have a height (in direction Z) in the range of 10 to 50 nm.

In the example of FIGS. 5A-5C, the angled dielectric bar 122-2 and the vertical dielectric bar 122-4 are optionally recessed prior to formation of the gate stack 124 (e.g., by patterning a mask over the structure which protects the gate cuts 122-1, 122-3 and 122-5). Recessing the angled dielectric bar 122-2 and the vertical dielectric bar 122-4 enables a shared gate for transistor devices which use portions of the nanosheet channel layers 106 on either side of the angled dielectric bar 122-2 and the vertical dielectric bar 122-4. For example, the portions of the nanosheet channel layers 106 on a first side of the angled dielectric bar 122-2 may provide channels for pFETs while the portions of the nanosheet channel layers 106 on a second side of the angled dielectric bar 122-2 may provide channels for nFETs, or vice versa. Similarly, the portions of the nanosheet channel layers 106 on a first side of the vertical dielectric bar 122-4 may provide channels for pFETs while the portions of the nanosheet channel layers 106 on a second side of the vertical dielectric bar 122-4 may provide channels for nFETs, or vice versa.

Figures 6A, 6B, 6C:
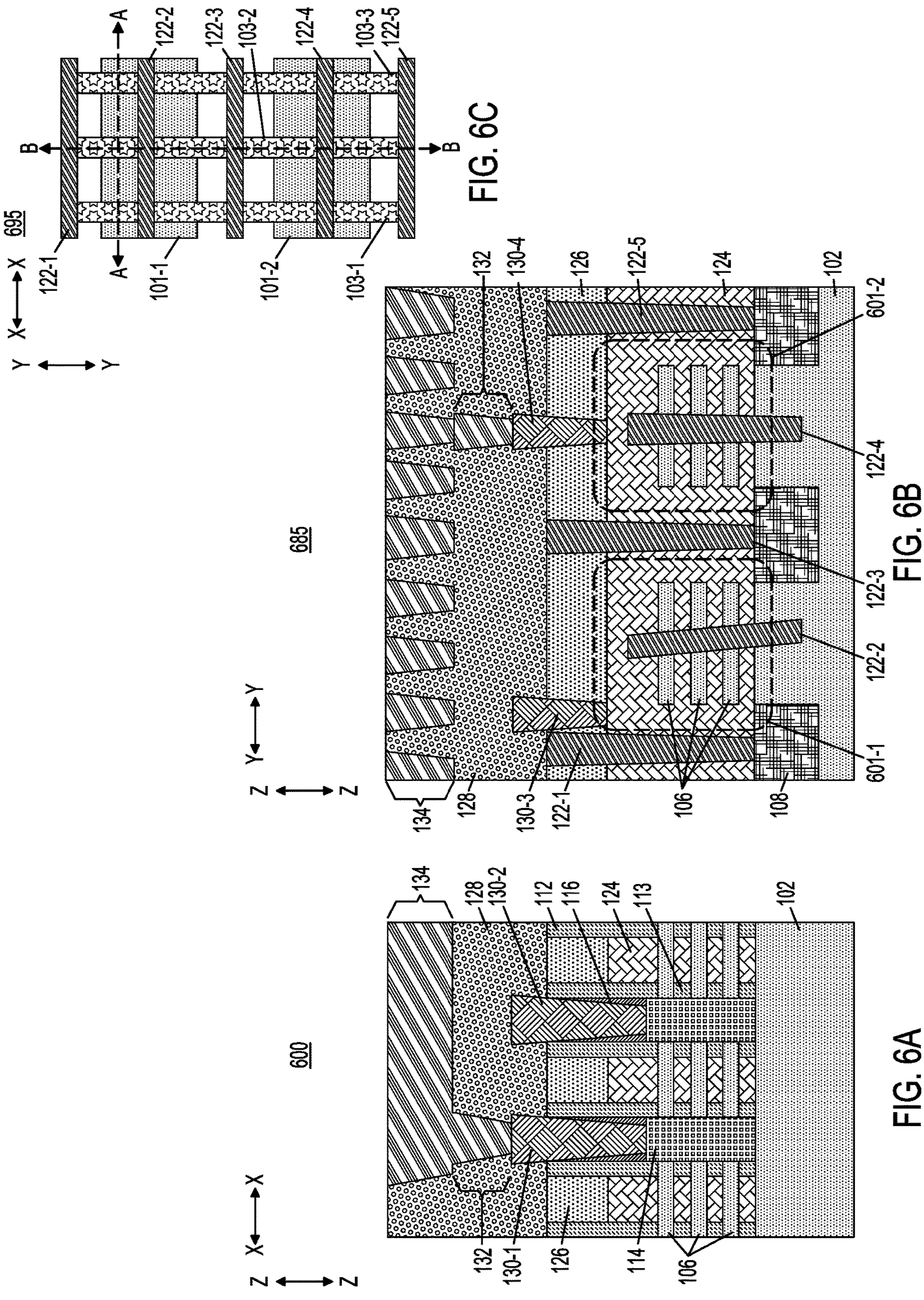
FIG. 6A depicts a first cross-sectional view of the semiconductor structure of FIGS. 5A-5C following formation of middle-of-line contacts and back-end-of-line interconnects, according to an embodiment of the invention.
FIG. 6B depicts a second cross-sectional view of the semiconductor structure of FIGS. 5A-5C following the formation of the middle-of-line contacts and the back-end-of-line interconnects, according to an embodiment of the invention.
FIG. 6C depicts a top-down view illustrating where the first and second cross-sectional views of FIGS. 6A and 6B are taken, according to an embodiment of the invention.

FIGS. 6A-6C show different views of the structure of FIGS. 5A-5C following MOL and BEOL formation. FIG. 6A shows a first cross-sectional view 600 of the semiconductor structure, and FIG. 6B shows a second cross-sectional view 685 of the semiconductor structure. FIG. 6C shows a top-down view 695, illustrating where the first and second cross-sectional views 600 and 685 of FIGS. 6A and 6B are taken. The first cross-sectional view 600 of FIG. 6A is taken along the line A-A shown in the top-down view 695 of FIG. 6C. The second cross-sectional view 685 of FIG. 6B is taken along the line B-B shown in the top-down view 695 of FIG. 6C.

An ILD layer 128 is formed over the structure, followed by patterning of trenches through the ILD layer 128, the ILD layer 116 and the SAC capping layer 126. The trenches in the ILD layer 116 are filled with a contact material (e.g., a silicide liner, such as titanium (Ti), nickel (Ni), a nickel-platinum alloy (NiPt), etc., a metal adhesion liner such as TiN, and a conductive metal fill such as tungsten (W), cobalt (Co), ruthenium (Ru), etc.) for forming MOL contacts 130-1 and 130-2 to the source/drain regions 114. The trenches in the SAC capping layer 126 are filled with the contact material for forming MOL contacts 130-3 and 130-4 to the gate stack 124. BEOL interconnects are then formed in the ILD layer 128, with the BEOL interconnects including a first via layer 132 (e.g., a V0 layer) and a first metallization layer 134 (e.g., an M1 layer). Although not shown, the BEOL interconnects may include one or more additional via and metallization layers or levels to provide the desired interconnections to the MOL contacts 130-1 through 130-4.

FIG. 6B also highlights different complementary metal-oxide-semiconductor (CMOS) cells 601-1 and 601-2, where the CMOS cells 601-1 and 601-2 have different N2P ratios. The angle of the angled dielectric bar 122-2 allows for tuning the N2P ratio of the CMOS cell 601-1 (e.g., the relative sizes of portions of the nanosheet channel layers 106 on either side of the angled dielectric bar 122-2). This is contrasted with the CMOS cell 601-2, where the vertical dielectric bar 122-4 approximately evenly divides the nanosheet channel layers 106 (e.g., the size of the nanosheet channel layers 106 on either side of the vertical dielectric bar 122-4 is about the same). Advantageously, the formation of the angled dielectric bar 122-2 does not change the front-end-of-line (FEOL) and BEOL layout of the overall structure.

Figures 7A, 7B, 7C:
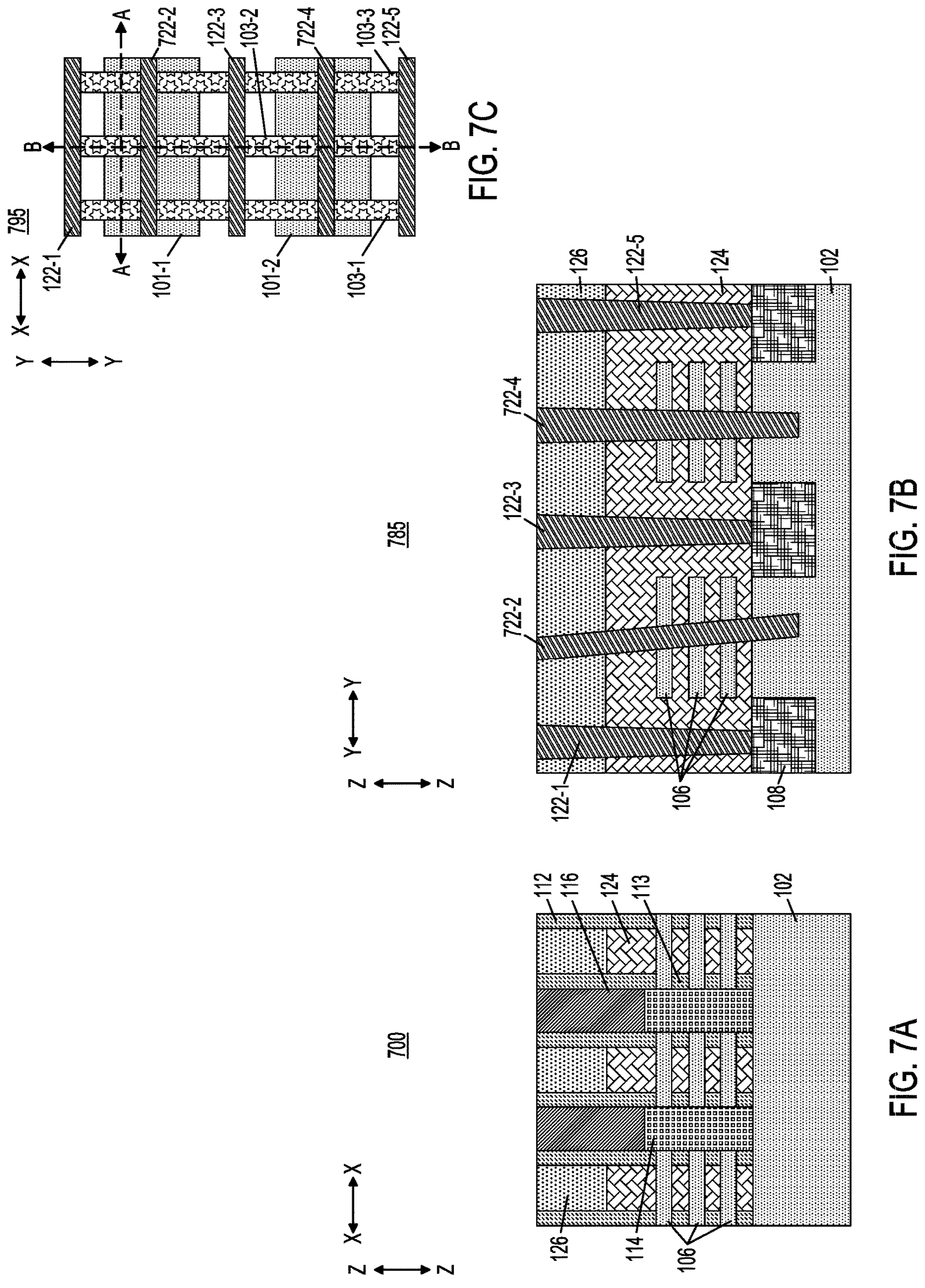
FIG. 7A depicts a first cross-sectional view of a semiconductor structure similar to that of FIGS. 5A-5C where the angled and vertical dielectric bars are not recessed below the top surfaces of the gate stacks, according to an embodiment of the invention.
FIG. 7B depicts a second cross-sectional view of the semiconductor structure similar to that of FIGS. 5A-5C where the angled and vertical dielectric bars are not recessed below the top surfaces of the gate stacks, according to an embodiment of the invention.
FIG. 7C depicts a top-down view illustrating where the first and second cross-sectional views of FIGS. 7A and 7B are taken, according to an embodiment of the invention.

FIGS. 7A-7C show different views of a structure similar to that of FIGS. 5A-5C, but where the angled dielectric bar 122-2 and the vertical dielectric bar 122-4 are not recessed below a top surface of the gate stack 124. FIG. 7A shows a first cross-sectional view 700 of the semiconductor structure, and FIG. 7B shows a second cross-sectional view 785 of the semiconductor structure. FIG. 7C shows a top-down view 795, illustrating where the first and second cross-sectional views 700 and 785 of FIGS. 7A and 7B are taken. The first cross-sectional view 700 of FIG. 7A is taken along the line A-A shown in the top-down view 795 of FIG. 7C. The second cross-sectional view 785 of FIG. 7B is taken along the line B-B shown in the top-down view 795 of FIG. 7C.

The structure of FIGS. 7A-7C is similar to that of FIGS. 5A-5C, though the angled dielectric bar 122-2 is replaced with an angled dielectric bar 722-2, the vertical dielectric bar 122-4 is replaced with a vertical dielectric bar 722-4.

Figure 8C:
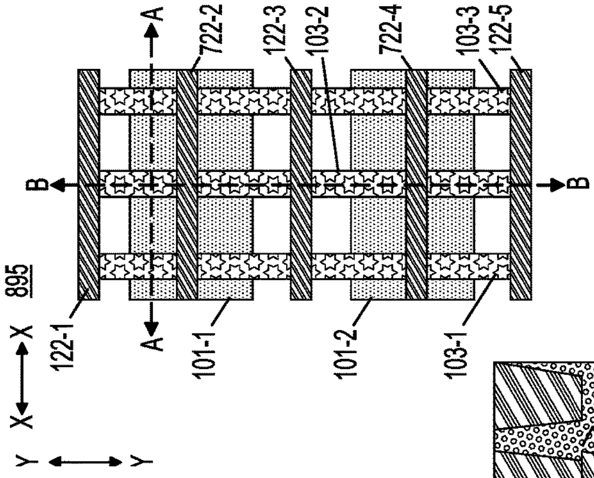
FIG. 8C depicts a top-down view illustrating where the first and second cross-sectional views of FIGS. 8A and 8B are taken, according to an embodiment of the invention.
Figure 8B:
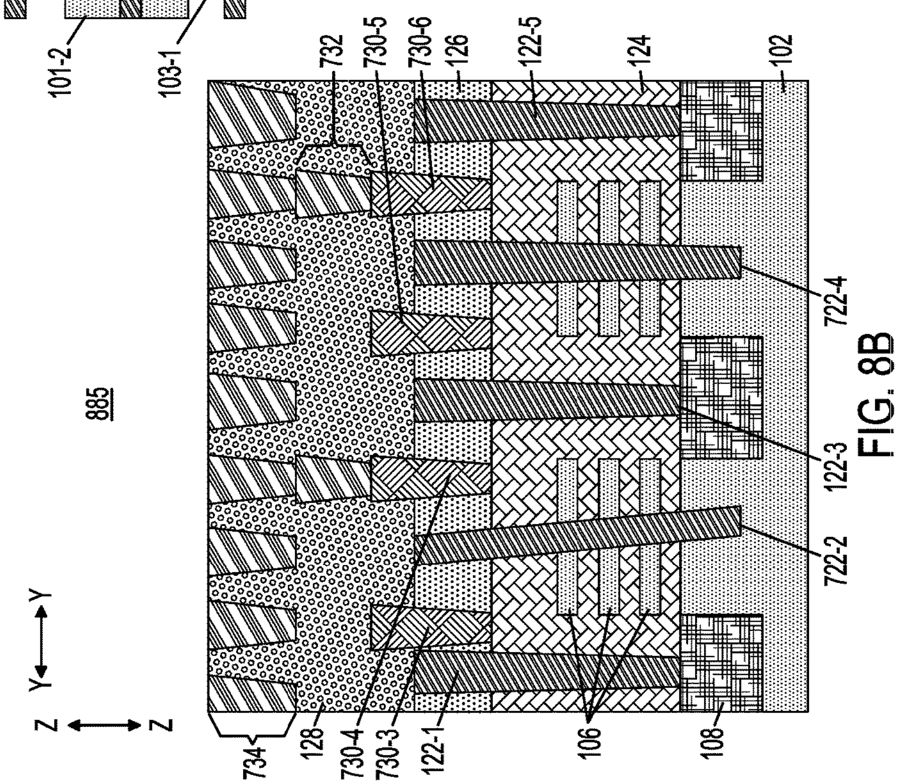
FIG. 8B depicts a second cross-sectional view of the semiconductor structure of FIGS. 7A-7C following the formation of the middle-of-line contacts and the back-end-of-line interconnects, according to an embodiment of the invention.
Figure 8A:
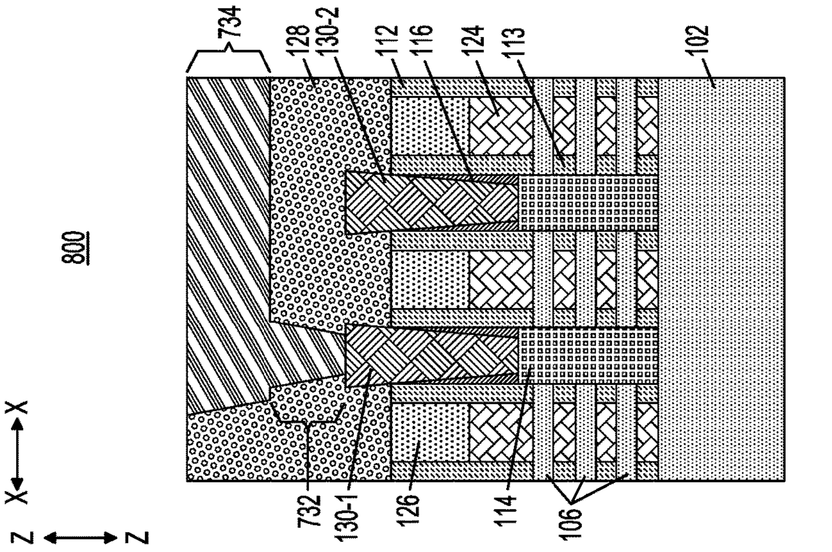
FIG. 8A depicts a first cross-sectional view of the semiconductor structure of FIGS. 7A-7C following formation of middle-of-line contacts and back-end-of-line interconnects, according to an embodiment of the invention.

FIGS. 8A-8C show different views of a structure similar to that of FIGS. 7A-7C following MOL and BEOL formation. FIG. 8A shows a first cross-sectional view 800 of the semiconductor structure, and FIG. 8B shows a second cross-sectional view 885 of the semiconductor structure. FIG. 8C shows a top-down view 895, illustrating where the first and second cross-sectional views 800 and 885 of FIGS. 8A and 8B are taken. The first cross-sectional view 800 of FIG. 8A is taken along the line A-A shown in the top-down view 895 of FIG. 8C. The second cross-sectional view 885 of FIG. 8B is taken along the line B-B shown in the top-down view 895 of FIG. 8C.

The MOL contacts include the MOL contacts 130-1 and 130-2 described above, as well as MOL contacts 730-3, 730-4, 730-5 and 730-6. The MOL contacts 730-3 and 730-4 provide contacts to portions of the gate stack 124 on either side of the angled dielectric bar 722-2, while the MOL contacts 730-5 and 730-6 provide contacts to portions of the gate stack 124 on either side of the vertical dielectric bar 722-4. The BEOL structure of FIGS. 8A-8C is similar to that BEOL structure of FIGS. 6A-6C, including a via layer 732 (e.g., a V0 layer) and a metallization layer 734 (e.g., an M1 layer). Again, the BEOL structure may include more via and metallization layers or levels as needed to form desired interconnects to the MOL contacts. In the structure of FIGS. 8A-8C, the angled dielectric bar 722-2 and the vertical dielectric bar 722-4 are not recessed below the top surface of the gate stack 124, thus allowing individualized contact to the gate stack 124 on either side of the angled dielectric bar 722-2 (e.g., through MOL contacts 730-3 and 730-4) and the vertical dielectric bar (e.g., through MOL contacts 730-5 and 730-6).

Although FIGS. 5A-6C and FIGS. 7A-8C show respective structures where both the angled and vertical dielectric bars (122-2 and 122-4 in FIGS. 5A-6C, 722-2 and 722-4 in FIGS. 7A-8C) are either both recessed below the top surface of the gate stack 124 or not, it should be appreciated that in some embodiments the same structure may include angled dielectric bars which are recessed below the top surface of the gate stack 124 and vertical dielectric bars which are not recessed below the top surface of the gate stack, or vice versa. Further, in some embodiments a structure may include a first set of angled dielectric bars which are recessed below the top surface of the gate stack and a second set of angled dielectric bars which are not recessed below the top surface of the gate stack, and/or a first set of vertical dielectric bars which are recessed below the top surface of the gate stack and a second set of vertical dielectric bars which are not recessed below the top surface of the gate stack.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOS transistors, metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 9:
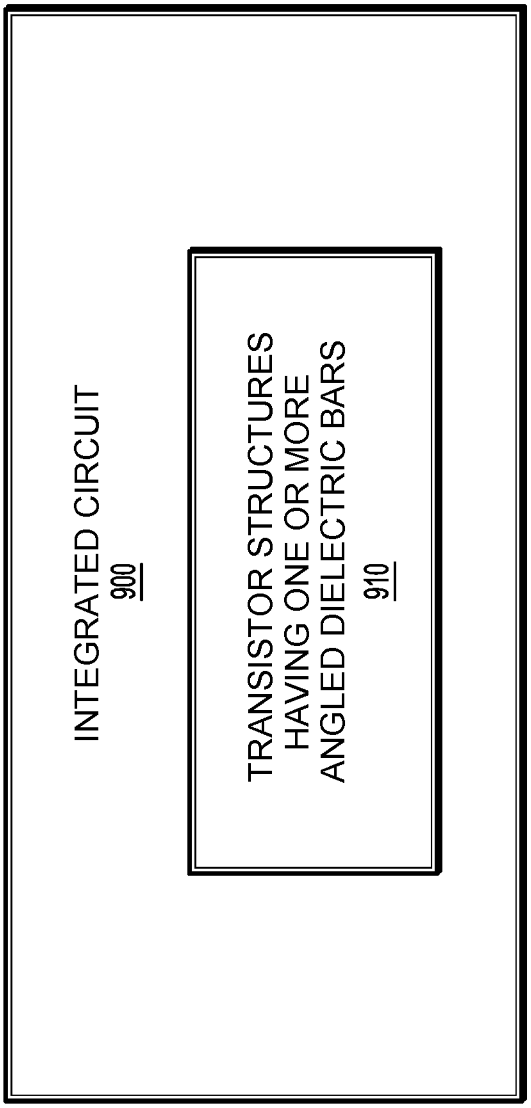
FIG. 9 shows an integrated circuit comprising one or more transistor structures having one or more angled dielectric bars, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 9 shows an example integrated circuit 900 which includes one or more transistor structures 910 having one or more angled dielectric bars or walls.

In some embodiments, a semiconductor structure includes a substrate, one or more nanosheet channel layers disposed over the substrate, and a dielectric bar attached to the one or more nanosheet channel layers, where the dielectric bar is not perpendicular to the substrate.

The one or more nanosheet channel layers may include a first set of one or more nanosheet channels attached to a first side of the dielectric bar and a second set of one or more nanosheet channels attached to a second side of the dielectric bar. The first set of one or more nanosheet channels may be channels for n-type transistors and the second set of one or more nanosheet channels may be channels for p-type transistors. An N2P ratio of the first set of one or more nanosheet channels to the second set of one or more nanosheet channels is a function of an angle of the dielectric bar.

The semiconductor structure may further include one or more additional nanosheet channel layers disposed over the substrate, and an additional dielectric bar attached to the one or more additional nanosheet channel layers, the additional dielectric bar being perpendicular to the substrate. The one or more nanosheet channel layers include a first set of one or more nanosheet channels attached to a first side of the dielectric bar providing channels for a first set of n-type transistors and a second set of one or more nanosheet channels attached to a second side of the dielectric bar providing channels for a first set of p-type transistors, and the one or more additional nanosheet channel layers include a third set of one or more nanosheet channels attached to a first side of the additional dielectric bar providing channels for a second set of n-type transistors and a fourth set of one or more nanosheet channels attached to a second side of the additional dielectric bar providing channels for a second set of p-type transistors. The first set of one or more nanosheet channels and the second set of one or more nanosheet channels may have a first N2P ratio, and the third set of one or more nanosheet channels and the fourth set of one or more nanosheet channels may have a second N2P ratio, the second N2P ratio being different than the first N2P ratio.

The semiconductor structure may further include a gate stack surrounding the one or more nanosheet channel layers, where the dielectric bar is recessed below a top surface of the gate stack.

In some embodiments, a transistor structure includes a substrate, one or more nanosheet channel layers disposed over the substrate, the one or more nanosheet channel layers providing channels for a CMOS device, and a dielectric bar attached to the one or more nanosheet channel layers, where the dielectric bar is not perpendicular to the substrate.

The one or more nanosheet channel layers may include a first set of one or more nanosheet channels attached to a first side of the dielectric bar providing channels for an n-type transistor of the CMOS device and a second set of one or more nanosheet channels attached to a second side of the dielectric bar providing channels for a p-type transistor of the CMOS device. An N2P ratio of the CMOS device may be a function of an angle of the dielectric bar.

The transistor structure may further include one or more additional nanosheet channel layers disposed over the substrate, the one or more additional nanosheet channel layers providing channels for an additional CMOS device, and an additional dielectric bar attached to the one or more additional nanosheet channel layers, the additional dielectric bar being perpendicular to the substrate. The one or more nanosheet channel layers may include a first set of one or more nanosheet channels attached to a first side of the dielectric bar providing channels for an n-type transistor of the CMOS device and a second set of one or more nanosheet channels attached to a second side of the dielectric bar providing channels for a p-type transistor of the CMOS device, and the one or more additional nanosheet channel layers may include a third set of one or more nanosheet channels attached to a first side of the additional dielectric bar providing channels for an n-type transistor of the additional CMOS device and a fourth set of one or more nanosheet channels attached to a second side of the additional dielectric bar providing channels for a p-type transistor of the additional CMOS device. The CMOS device may have a first N2P ratio, and the additional CMOS device may have a second N2P ratio, the second N2P ratio being different than the first N2P ratio.

The transistor structure may further include a gate stack surrounding the one or more nanosheet channel layers, where the dielectric bar is recessed below a top surface of the gate stack. The CMOS device may utilize a forksheet transistor architecture.

In some embodiments, an integrated circuit includes a transistor structure including a substrate, one or more nanosheet channel layers disposed over the substrate, the one or more nanosheet channel layers providing channels for a CMOS device, and a dielectric bar attached to the one or more nanosheet channel layers, where the dielectric bar is not perpendicular to the substrate.

The one or more nanosheet channel layers may include a first set of one or more nanosheet channels attached to a first side of the dielectric bar providing channels for an n-type transistor of the CMOS device and a second set of one or more nanosheet channels attached to a second side of the dielectric bar providing channels for a p-type transistor of the CMOS device.

The transistor structure may further include one or more additional nanosheet channel layers disposed over the substrate, the one or more additional nanosheet channel layers providing channels for an additional CMOS device, and an additional dielectric bar attached to the one or more additional nanosheet channel layers, the additional dielectric bar being perpendicular to the substrate. The CMOS device may have a first N2P ratio, and the additional CMOS device may have a second N2P ratio, the second N2P ratio being different than the first N2P ratio.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms “approximately” or “substantially” as used herein with regard to thicknesses, widths, percentages, ranges, temperatures, times and other process parameters, etc., are meant to denote being close or approximate to, but not exactly. For example, the term “approximately” or “substantially” as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:

a substrate;

one or more nanosheet channel layers disposed over the substrate; and a dielectric bar attached to the one or more nanosheet channel layers;

wherein the dielectric bar is not perpendicular to the substrate;

wherein the one or more nanosheet channel layers comprise a first set of one or more nanosheet channel layers for n-type transistors attached to a first side of the dielectric bar and a second set of one or more nanosheet channel layers for p-type transistors attached to a second side of the dielectric bar; and wherein a ratio of a size of the first set of one or more nanosheet channel layers for the n-type transistors attached to the first side of the dielectric bar to a size of the second set of one or more nanosheet channel layers for the p-type transistors attached to the second side of the dielectric bar is a function of an angle of the dielectric bar with respect to the substrate.

2. The semiconductor structure of claim 1, further comprising:

one or more additional nanosheet channel layers disposed over the substrate; and an additional dielectric bar attached to the one or more additional nanosheet channel layers, the additional dielectric bar being perpendicular to the substrate.

3. The semiconductor structure of claim 2 wherein the one or more additional nanosheet channel layers comprise a third set of one or more nanosheet channels attached to a first side of the additional dielectric bar providing channels for one or more additional n-type transistors and a fourth set of one or more nanosheet channels attached to a second side of the additional dielectric bar providing channels for one or more additional p-type transistors.

4. The semiconductor structure of claim 3, wherein the ratio of the size of the first set of one or more nanosheet channels to the size of the second set of one or more nanosheet channels is different than a ratio of a size of the third set of one or more nanosheet channels to a size of the fourth set of one or more nanosheet channels.

5. The semiconductor structure of claim 1, further comprising a gate stack surrounding the one or more nanosheet channel layers, wherein the dielectric bar is recessed below a top surface of the gate stack.

6. The semiconductor structure of claim 1, further comprising a gate stack surrounding the one or more nanosheet channel layers, wherein the dielectric bar extends above a top surface of the gate stack.

7. A transistor structure, comprising:

a substrate;

one or more nanosheet channel layers disposed over the substrate, the one or more nanosheet channel layers providing channels for a complementary metal-oxide-semiconductor device; and a dielectric bar attached to the one or more nanosheet channel layers;

wherein the dielectric bar is not perpendicular to the substrate;

wherein the one or more nanosheet channel layers comprise a first set of one or more nanosheet channels attached to a first side of the dielectric bar providing channels for an n-type transistor of the complementary metal-oxide-semiconductor device and one or more nanosheet channels attached to a second side of the dielectric bar providing channels for a p-type transistor of the complementary metal-oxide-semiconductor device; and wherein a ratio of a size of the first set of one or more nanosheet channel layers attached to the first side of the dielectric bar providing channels for the n-type transistor of the complementary metal-oxide-semiconductor device to a size of the second set of one or more nanosheet channels attached to the second side of the dielectric bar providing channels for the p-type transistor of the complementary metal-oxide-semiconductor device is a function of an angle of the dielectric bar with respect to the substrate.

8. The transistor structure of claim 7, further comprising:

one or more additional nanosheet channel layers disposed over the substrate, the one or more additional nanosheet channel layers providing channels for an additional complementary metal-oxide-semiconductor device; and an additional dielectric bar attached to the one or more additional nanosheet channel layers, the additional dielectric bar being perpendicular to the substrate.

9. The transistor structure of claim 8 wherein the one or more additional nanosheet channel layers comprise a third set of one or more nanosheet channels attached to a first side of the additional dielectric bar providing channels for an n-type transistor of the additional complementary metal-oxide-semiconductor device and a fourth set of one or more nanosheet channels attached to a second side of the additional dielectric bar providing channels for a p-type transistor of the additional complementary metal-oxide-semiconductor device.

10. The integrated circuit of claim 8, wherein ratio of the size of the first set of one or more nanosheet channel layers attached to the first side of the dielectric bar providing channels for the n-type transistor of the complementary metal-oxide-semiconductor device to a size of the second set of one or more nanosheet channels attached to the second side of the dielectric bar providing channels for the p-type transistor of the complementary metal-oxide-semiconductor device is different than a ratio of a size of the third set of one or more nanosheet channel layers attached to the first side of the additional dielectric bar providing channels for the n-type transistor of the additional complementary metal-oxide-semiconductor device to a size of the fourth set of one or more nanosheet channels attached to the second side of the additional dielectric bar providing channels for the p-type transistor of the additional complementary metal-oxide-semiconductor device.

11. The transistor structure of claim 7, further comprising a gate stack surrounding the one or more nanosheet channel layers, wherein the dielectric bar is recessed below a top surface of the gate stack.

12. The transistor structure of claim 7, wherein the complementary metal-oxide-semiconductor device utilizes a forksheet transistor architecture.

13. The transistor structure of claim 7, further comprising a gate stack surrounding the one or more nanosheet channel layers, wherein the dielectric bar extends above a top surface of the gate stack.

14. An integrated circuit comprising:

a transistor structure comprising:

a substrate;

one or more nanosheet channel layers disposed over the substrate, the one or more nanosheet channel layers providing channels for a complementary metal-oxide-semiconductor device; and a dielectric bar attached to the one or more nanosheet channel layers;

wherein the dielectric bar is not perpendicular to the substrate;

wherein the one or more nanosheet channel layers comprise a first set of one or more nanosheet channel layers for n-type transistors attached to a first side of the dielectric bar and one or more nanosheet channel layers for p-type transistors attached to a second side of the dielectric bar; and wherein a ratio of a size of the first set of one or more nanosheet channel layers for the n-type transistors attached to the first side of the dielectric bar to a size of the second set of one or more nanosheet channel layers for the p-type transistors attached to the second side of the dielectric bar is a function of an angle of the dielectric bar with respect to the substrate.

15. The integrated circuit of claim 14, wherein the transistor structure further comprises:

one or more additional nanosheet channel layers disposed over the substrate, the one or more additional nanosheet channel layers providing channels for an additional complementary metal-oxide-semiconductor device; and an additional dielectric bar attached to the one or more additional nanosheet channel layers, the additional dielectric bar being perpendicular to the substrate.

16. The integrated circuit of claim 15 wherein the one or more additional nanosheet channel layers comprise a third set of one or more nanosheet channels attached to a first side of the additional dielectric bar providing channels for an n-type transistor of the additional complementary metal-oxide-semiconductor device and a fourth set of one or more nanosheet channels attached to a second side of the additional dielectric bar providing channels for a p-type transistor of the additional complementary metal-oxide-semiconductor device.

17. The integrated circuit of claim 16 wherein the ratio of the size of the first set of one or more nanosheet channels to the size of the second set of one or more nanosheet channels is different than a ratio of a size of the third set of one or more nanosheet channels to a size of the fourth set of one or more nanosheet channels.

18. The integrated circuit of claim 14, further comprising a gate stack surrounding the one or more nanosheet channel layers, wherein the dielectric bar extends above a top surface of the gate stack.

* * * * *